United States Patent [19]
Lee et al.

[11] Patent Number: 5,661,685
[45] Date of Patent: Aug. 26, 1997

[54] PROGRAMMABLE LOGIC DEVICE WITH CONFIGURABLE POWER SUPPLY

[75] Inventors: Napoleon W. Lee, Milpitas; Derek R. Curd, San Jose; Sholeh Diba, Los Gatos; Prasad Sastry, Milpitas; Mihai G. Statovici; Kameswara K. Rao, both of San Jose, all of Calif.

[73] Assignee: Xilinx, Inc., San Jose, Calif.

[21] Appl. No.: 533,131

[22] Filed: Sep. 25, 1995

[51] Int. Cl.$^6$ .................................... G11C 7/00
[52] U.S. Cl. .................. 365/185.22; 365/185.18; 365/185.01; 365/185.05; 365/185.24; 365/185.26; 365/185.28
[58] Field of Search .................. 365/218, 185.22, 365/189.01, 230.01, 185.18, 185.01, 185.05, 185.24, 185.26, 185.28

[56] References Cited

U.S. PATENT DOCUMENTS

| | | | |
|---|---|---|---|
| 5,297,096 | 3/1994 | Terada et al. | 365/218 |
| 5,386,422 | 1/1995 | Endoh et al. | 371/21.5 |
| 5,428,568 | 6/1995 | Kobayashi et al. | 365/185 |
| 5,528,546 | 6/1996 | Chao et al. | 365/185.21 |
| 5,541,879 | 7/1996 | Suh et al. | 365/185.22 |

*Primary Examiner*—Viet Q. Nguyen
*Attorney, Agent, or Firm*—Skjerven, Morrill, MacPherson, Franklin & Friel; Jeanette S. Harms

[57] ABSTRACT

An integrated programmable logic device (PLD) includes flash EPROM storage transistors. The PLD includes a multiplexor that selectively provides program, erase, or verify voltages to the storage transistors. The program, erase, and verify voltages may be supplied using external power supplies or may be generated internally by on-chip charge-pump generators. A configurable memory on the PLD is used to adjust the output voltages from each of the on-chip charge-pump generators.

16 Claims, 14 Drawing Sheets

PROGRAMMABLE LOGIC DEVICE WITH CONFIGURABLE POWER SUPPLY

CROSS-REFERENCE TO RELATED APPLICATIONS

The present application is related to application Ser. No. 08/533,412, filed on the same date as this application, entitled "Wordline Driver For Flash PLD," by inventors Napoleon W. Lee, Derek R. Curd, Wei-Yi Ku, Sholeh Diba, and George Simmons (attorney docket number X-181), and to application Ser. No. 08/533,413, also filed on the same data as this application, entitled "High-Voltage Power Multiplexor," by Derek R. Curd (attorney docket number X-199), both of which are incorporated herein by this reference.

BACKGROUND OF THE INVENTION

1. Field of the Invention

This invention relates generally to programmable logic devices (PLDs), and particularly to complex PLDs that may be reconfigured dynamically.

2. Field of Related Art

Programmable logic devices (PLDs) are well-known integrated circuits that may be programmed to perform logic functions. Numerous types of memory elements may be used in PLD architectures to provide programmability. One such memory cell, known as a flash memory cell, is both electrically erasable and programmable. A basic flash memory cell 100 is shown in FIG. 1a.

Flash memory cell 100 includes an access transistor 110 and a double-polysilicon storage transistor 120. Storage transistor 120 has a floating polysilicon gate 122 that is isolated in silicon dioxide and capacitively coupled to a polysilicon control gate 124. Storage transistor 120 also has a region of silicon dioxide between the floating gate 122 and a source 128 that is thin enough to permit electrons to tunnel to and from floating gate 122 when the proper bias voltages are applied to the terminals of storage transistor 120. The region of silicon dioxide is conventionally known as the "tunnel oxide."

Referring to FIG. 1a, storage transistor 120 is programmed by grounding its source 128, applying approximately five to 6 volts to its drain 126, and connecting its control gate 124 to a programming voltage $V_{PP}$ that is high relative to the operating voltage $V_{CC}$. Typical values of the programming voltage $V_{PP}$ and operating voltage $V_{CC}$ are ten volts and five volts, respectively. With storage transistor 120 thus biased, electrons travel through the tunnel oxide to the floating gate 122, leaving the floating gate 122 with a net negative charge. This net negative charge shifts the threshold voltage $V_t$ (i.e., the voltage at which an MOS transistor begins to conduct) of storage transistor 120 in the positive direction to a voltage that is greater than $V_{CC}$.

As shown in FIG. 1b, storage transistor 120 is erased by grounding control gate 124 and applying a relatively high voltage (e.g., eleven volts) to the source 128. This bias allows electrons to tunnel away from the floating gate 122 through the tunnel oxide to be swept away by the large positive voltage on the source 128. The loss of electrons (i.e., the loss of negative charge) on floating gate 122 shifts the threshold voltage $V_t$ of storage transistor 120 in the negative direction to a voltage that is less than $V_{CC}$.

When erasing storage transistor 120, it is possible to remove too many electrons from floating gate 122, resulting in excess positive charge on floating gate 122. This condition is commonly known as "over-erase." Access transistor 110 is provided to prevent storage transistor 120 conducting in the event that storage transistor 120 is over-erased.

When the PLD operates as a logic device, each of the storage transistors (e.g., storage transistor 120) has $V_{CC}$ applied to its control gate 124. The state of each storage transistor may then be "read" by determining whether the storage transistor conducts. If the storage transistor is programmed, $V_{CC}$ is less than the threshold voltage $V_t$ so the storage transistor will not conduct if, on the other hand, the storage transistor is erased, $V_{CC}$ will be sufficient to turn the storage transistor on.

After flash memory cell 100 is programmed or erased, a test is generally performed to verify the state of storage transistor 120. For example, to verify that storage transistor 120 is properly programmed, a verify-program voltage $V_{VP}$ is applied to the control gate 124 to determine whether the threshold voltage $V_t$ of storage transistor 120 is sufficiently high to keep storage transistor 120 from conducting when $V_{CC}$ is applied to the control gate 124. The verify-program voltage $V_{VP}$ applied to the control gate 124 is greater than $V_{CC}$ by a safety factor of, for example, 3 volts. This safety factor allows for noise and for a possible negative shift of the threshold voltage $V_t$ caused by electrons escaping from the floating gate 122 over the life of memory cell 100.

As shown in FIG. 1c, when the programmed or erased state of storage transistor 120 is verified, $V_{CC}$ is applied to the control gate of access transistor 110 to turn access transistor 110 on. A sense amplifier 150, coupled across the series connected access transistor 110 and storage transistor 120, determines whether storage transistor 120 conducts. If the threshold voltage $V_t$ of storage transistor 120 is sufficiently high, over eight volts for example, a verify-program voltage $V_{VP}$ of eight volts will not turn storage transistor 120 on. As a result, verify sense amplifier 150 will not sense current through the series coupled transistors 110 and 120.

After storage transistor 120 is erased, the state of erasure may be verified by ensuring that storage transistor 120 conducts with a low $V_T$ threshold margin applied to control gate 124. This erase threshold margin value is about 2 V. $V_{CC}$ is then applied to the control gate of access transistor 110 to allow sense amplifier 150 to access storage transistor 120. If storage transistor 120 is properly erased, verify sense amplifier 150 will detect a current through series transistors 110 and 120 with the two-volt verify-erase voltage $V_{VE}$ applied to the control gate 124 and $V_{CC}$ applied to the control gate of access transistor 110.

When a flash PLD functions as a logic device (i.e., when the PLD is in the "logic mode"), the PLD requires only a five-volt power supply. However, as discussed above, other modes, such as program and erase, require additional power supply voltages greater than $V_{CC}$. To satisfy the requirement of additional power supply voltages, conventional PLDs use an external power supply capable of providing at least a programming voltage on a terminal $V_{PP}$.

FIG. 2 shows a typical program/verify scheme for a conventional storage transistor of a PLD. The following discussion describes this program/verify scheme as applied to storage transistor 120.

The program/verify signal PGMVFY is an internally-provided logic signal. When PGMFVY goes from zero to five volts (i.e., from a logic zero to a logic one) the PLD enters the. program/verify mode. In the program-verify mode, $V_{PP}$ begins at approximately twelve volts to program selected storage transistors, in this case storage transistor 120. An externally generated program-enable signal $PGM_{EN}$ (active-low) goes to zero volts while $V_{PP}$ is held at twelve volts. The low $PGM_{EN}$ signal activates various components (not shown) in the PLD to provide the appropriate programming bias voltages to storage transistor 120. $PGM_{EN}$ remains zero for a time TP long enough to program storage transistor 120.

After storage transistor 120 has been programmed as described above, the $PGM_{EN}$ signal returns to five volts and the externally supplied programming voltage from terminal $V_{PP}$ is brought to eight volts for the verify cycle. Once the signal on terminal $V_{PP}$ settles at eight volts, an externally provided verify-enable signal $VFY_{EN}$ (active-low) is brought from five to zero volts, thereby enabling the verify cycle.

During the verify cycle, when the verify enable signal is low the eight-volt verify signal on terminal $V_{PP}$ is applied to the control gate of storage transistor 120 to determine whether the threshold voltage $V_t$ of storage transistor 120 is sufficiently high to keep storage transistor 120 from conducting with eight volts applied to control gate 124.

The transition time $T_{TR}$ for the programming voltage on terminal $V_{PP}$ to drop from twelve to eight volts is typically several microseconds. By itself, transition time $T_{TR}$ is relatively short. However, there are generally tens of thousands of storage transistors to be programmed on a complex PLD. The cumulative effect of these transition times $T_{TR}$ is undesirable delay, especially when the testing process is automated. Hence, there exists a need for a complex PLD that may be tested more quickly than conventional complex PLDs.

A second problem that exists in PLDs is that the level of voltage that must be applied to the gate of a storage transistor (e.g., storage transistor 120) to cause the storage transistor to conduct enough current to trip the associated sense amplifier (e.g., verify sense amplifier 150) may vary due to process variations that effect the threshold voltage $V_t$ of the storage transistor and the sensitivity of the associated sense amplifier. Therefore, manufacturers experiment to determine the appropriate verify-program and verify-erase voltages. For example, experimentation may indicate that the verify-program voltage $V_{VP}$ should be 7.8 volts instead of 8 volts, in which case it would be necessary to adjust the verify-program $V_{VP}$ voltage to 7.8 volts.

Manufacturers of conventional PLDs must determine the actual values of the verify-program voltage $V_{VP}$ and the verify-erase voltage $V_{VE}$ and provide these values to the user (e.g. a third-party programmer). The user must then tailor the testing input voltages accordingly. Unfortunately, the need for such tailored voltages complicates the task of verifying the programmed and erased stages of storage transistors in PLDs and requires the user provide an adjustable power supply.

A third problem relates to the fact that each prior art device requires that programming and verify voltages be supplied by one or more external power supplies. This has become especially problematic for PLDs that are in-system programmable (i.e., PLDs that may be reconfigured without removing the PLD from the system in which it acts as a logic device). The need to supply programming voltages that are not necessary in the logic mode requires that the system employing the PLD include at least one additional power supply and that the PLD include at least one additional input pin. Moreover, as discussed above, the supply voltages used must be tailored to the particular needs of particular PLDs, depending on the required verify voltages. Hence, there exists a need for a PLD that does not require the use of external power supply voltages and that relieves the user of having to adjust power supply voltages to account for variations in verify voltage requirements.

SUMMARY OF THE INVENTION

The present invention is directed to a device that satisfies the need for an integrated PLD that (1) can be tested more quickly than conventional PLDs, (2) does not require the use of external power supply voltages, and (3) relieves the user of having to adjust power supply voltages to account for variations in verify voltage requirements.

One device having features of the present invention includes a storage transistor having a programmable threshold voltage. A programming-voltage generator provides the appropriate programming voltage for the control gate of the storage transistor. Similarly, an erase-voltage generator provides appropriate erase voltages for the storage transistor.

Once the storage transistor is programmed, a configurable program-verify generator provides a verify voltage to the control gate of the storage transistor. The program-verify generator is part of the integrated PLD along with the storage transistor. This placement of the program-verify generator eliminates the prior art requirement of an externally supplied verify voltage.

The program-verify generator includes memory elements that may be factory programmed to select an appropriate program-verify voltage, advantageously eliminating the need for the user to adjust the verify voltage to the appropriate level. A verify sense amplifier coupled to the source and drain terminals of the storage transistor indicates whether current passes through the storage transistor when the verify voltage is applied to the gate of the storage transistor. An erase-verify voltage source, that is also programmable, is provided for verifying that the storage transistor is properly erased.

A switch coupled to the programming-voltage supply, the program-verify generator, and the storage transistor alternately supplies the programming voltage or the program-verify voltage to the control gate. The switching speed of the switch is fast relative to the switching speed of an external power supply voltage, so that the use of the switch increases the speed at which the device may be tested. The switch may also be coupled to the erase-voltage supply and the erase-verify voltage source so that the switch may be used to quickly switch between the erase and erase-verify voltages.

These and other features, aspects, and advantages of the present invention will become better understood with reference to the following description, figures, and claims.

DETAILED DESCRIPTION OF THE FIGURES

Figure 3:
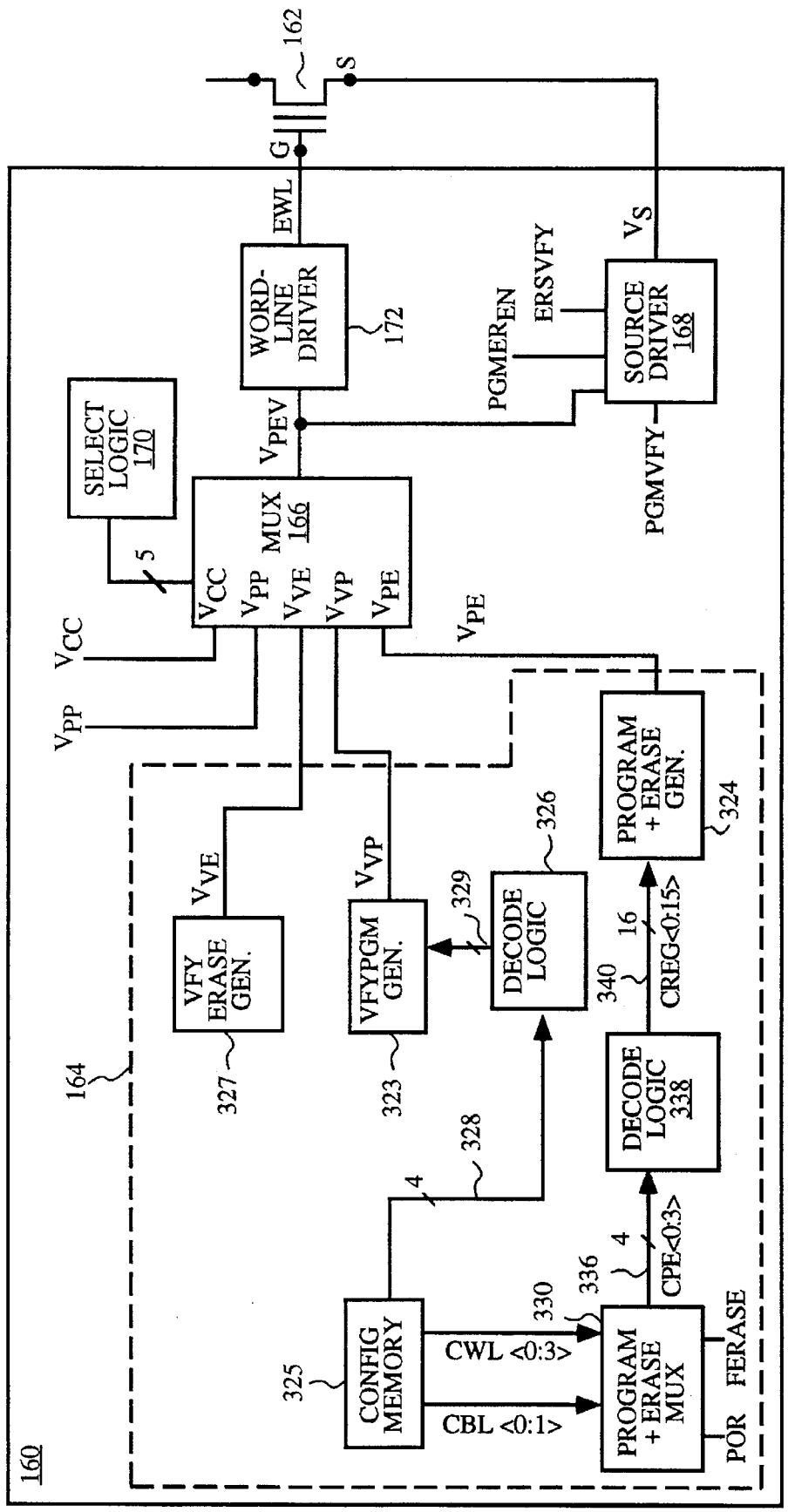
FIG. 3 shows a program/erase/verify circuit 160 coupled to a double-polysilicon storage transistor 162.

FIG. 3 shows a program/erase/verify circuit 160 in accordance with the invention coupled to a double-polysilicon storage transistor 162. Program/erase/verify circuit 160 includes an internal program/erase/verify voltage source 164, which outputs a verify-erase voltage on a terminal $V_{VE}$, a verify-program voltage on a terminal $V_{VP}$, and program/erase voltages on a terminal $V_{PE}$ to a program/erase/verify multiplexor 166. Multiplexor 166 is also coupled directly to $V_{CC}$ and to an external pin $V_{PP}$ that may be used to supply external program and verify voltages.

Voltage select logic 170 is coupled to five select inputs of multiplexor 166, and serves to select one of the five input voltages depending on the operating mode of the PLD (e.g. the program or erase modes) and provide the selected voltage on terminal $V_{PEV}$. Thus, multiplexor 166, in combination with select logic 170, serves as switch for providing any one of the voltages available on terminals $V_{CC}$, $V_{PP}$, $V_{VE}$, $V_{VP}$, and $V_{PE}$ to the terminal $V_{PEV}$.

The selected output of multiplexor 166 on terminal $V_{PEV}$ (e.g., a program, erase, or verify voltage) is fed to an input of a wordline driver 172 and to a source driver 168. Wordline driver 172 drives the wordline EWL, which is coupled to the gate G of storage transistor 162, while source driver 168 drives the source S of storage transistor 162 when the PLD is in either of the program or erase modes.

The verify-program voltage on terminal $V_{VP}$ and the program/erase voltages on terminal $V_{PE}$, because they are greater than $V_{CC}$, are generated by verify-program generator 323 and program/erase generator 324. Generating these voltages on-chip instead of supplying them with external power supplies eliminates the required additional external power supplies of the prior art. In addition, using multiplexor 166 to select between various voltage sources eliminates the need to change the voltage on terminal $V_{PP}$ from a program voltage to a program-verify voltage.

Figure 4:
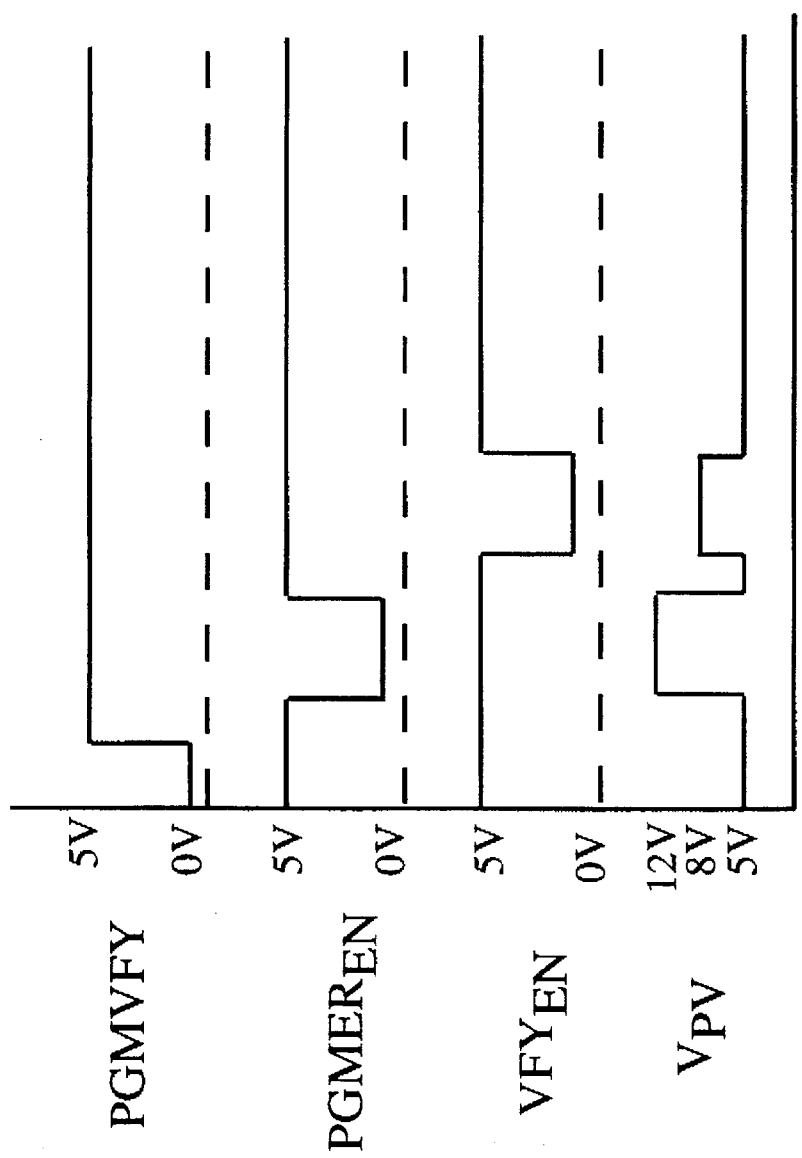
FIG. 4 shows a program/verify scheme in accordance with an embodiment of the present invention.

As shown in FIG. 4, the PLD enters the program-verify mode when the internally supplied program-verify signal on terminal PGMVFY goes from zero to five volts. Once in the program-verify mode, the program/erase enable signal on program/erase enable terminal PGMER$_{EN}$ goes low, causing the appropriate programming voltage on terminal $V_{PEV}$ to be applied to the gate G of storage transistor 162. The program/erase enable signal on terminal PGMER$_{EN}$ remains low long enough for storage transistor 162 to become programmed. Once the signal on terminal PGMER$_{EN}$ returns to five volts, the voltage on terminal $V_{PEV}$ also returns to five volts.

Next, the program/verify enable signal on verify-enable terminal VFY$_{EN}$ goes low, causing multiplexor 166 to select the verify-program voltage (approximately eight volts) on terminal $V_{VP}$ and convey that voltage through the wordline driver 172 to the gate G of storage transistor 162. Because the verify-program voltage on terminal $V_{VP}$ is available in addition to the programming voltage on terminal $V_{PE}$, the time required for the program-verify signal on terminal $V_{PEV}$ to transition from twelve to eight volts is the switching time of multiplexor 166. The voltage on terminal $V_{PEV}$ returns to five volts when the voltage on terminal VFY$_{EN}$ returns to five volts.

The program/program-verify mode may be used without an externally supplied input to programming voltage terminal $V_{PP}$. However, the charge-pumps of generator 324, which supply the programming and erase voltages on terminal $V_{PE}$, do not have the same power capacity as may be provided by an external power supply. Therefore, maximum program/erase speed is obtained when twelve volts is supplied externally to input terminal $V_{PP}$. The external power supply $V_{PP}$ may additionally be useful when programming/erasing multiple EPROM arrays simultaneously.

Figure 1:
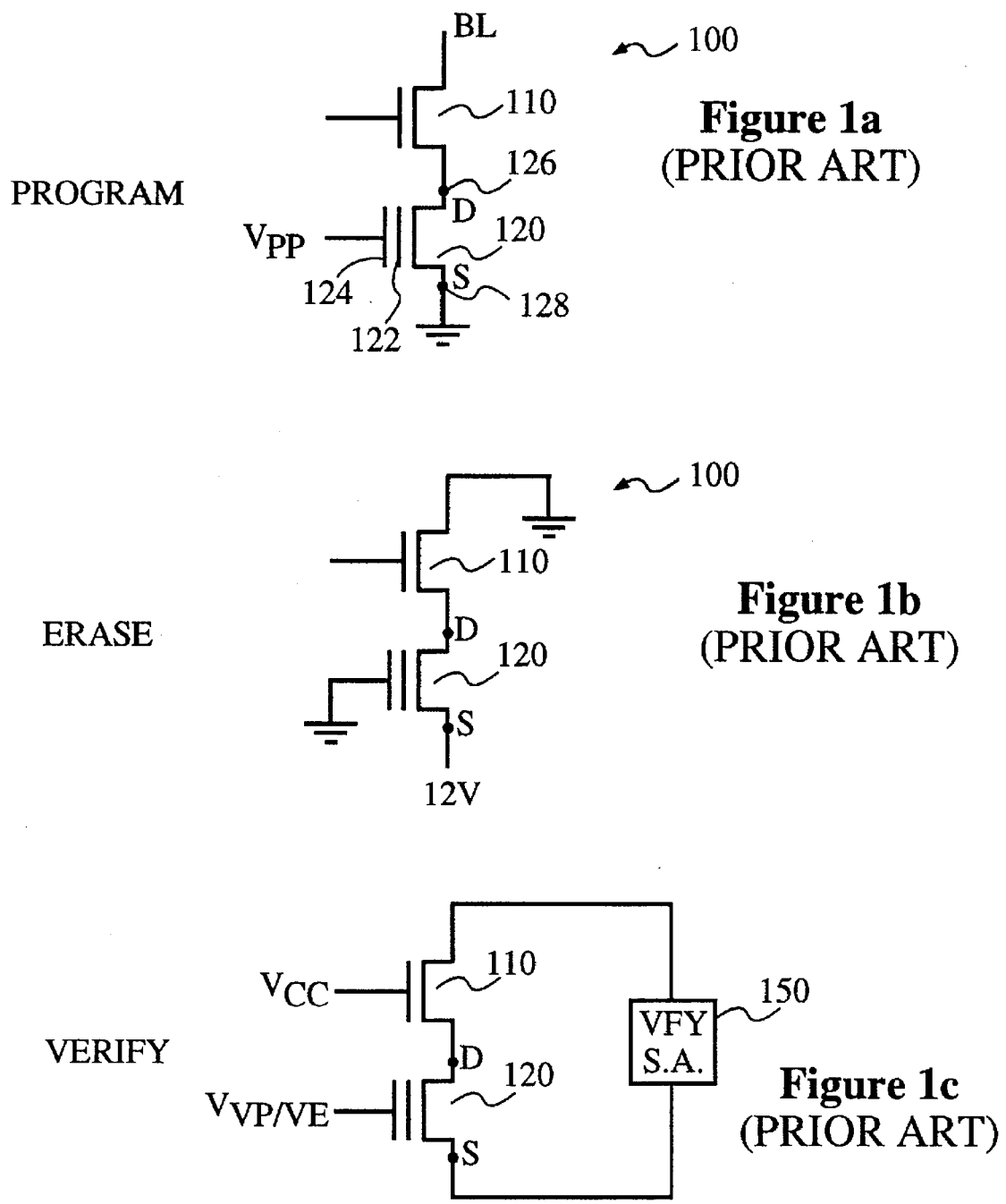
FIGS. 1a, 1b, and 1c show the voltages necessary to program, erase, and verify a basic flash memory cell 100.
Figure 2:
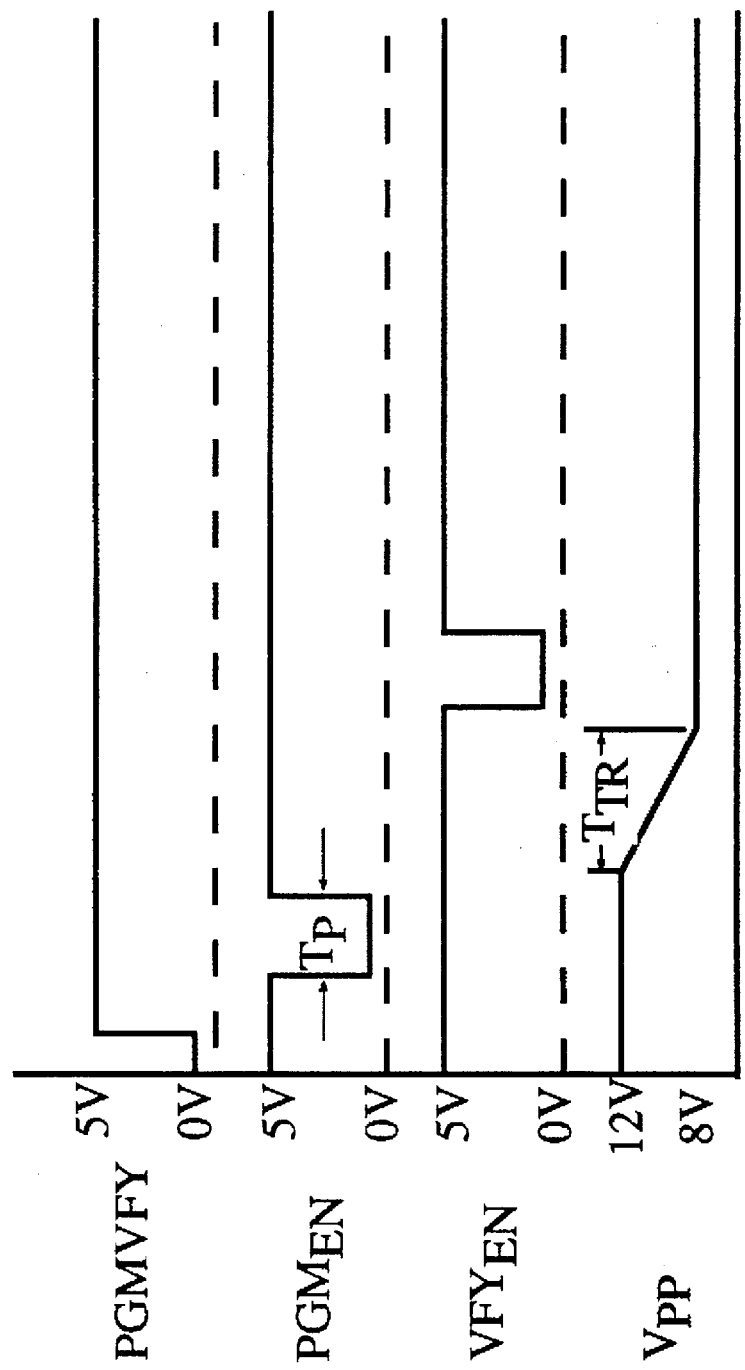
FIG. 2 shows a program/verify scheme for a conventional PLD.

While not shown in FIG. 4, similar time savings may be obtained in the erase mode when switching between the approximately twelve volts on terminal $V_{PE}$ necessary on the source S of storage transistor 162 and the approximately 2 volts verify erase voltage available on terminal $V_{VE}$ from an erase-verify generator 327. The erase mode is not used in the prior art PLD described in connection with FIG. 2 because those PLDs are not electrically erasable.

One embodiment of the invention is configured to allow the use of an externally-supplied verify-program voltage on terminal $V_{PP}$ when, for example, a test engineer wishes to experiment to determine the optimal program-verify voltage. In this embodiment, the external voltage level on input terminal $V_{PP}$ is supplied to a high-voltage detector (not shown) that has a high-voltage threshold of approximately ten volts. If the external voltage level on terminal $V_{PP}$ is less than the high-voltage threshold, select logic 170 causes multiplexor 166 to select the voltage level on terminal $V_{PP}$ in place of the verify-program voltage on terminal $V_{VP}$ when verifying the program voltage of storage transistor 162.

In another embodiment, if the external voltage level on terminal $V_{PP}$ is less than the high-voltage threshold, select logic 170 causes multiplexor 166 to select the external voltage on terminal $V_{PP}$ for the verify-erase voltage. This allows test engineers to use externally provided program-verify and erase-verify voltages to test the PLD.

Figure 5A:
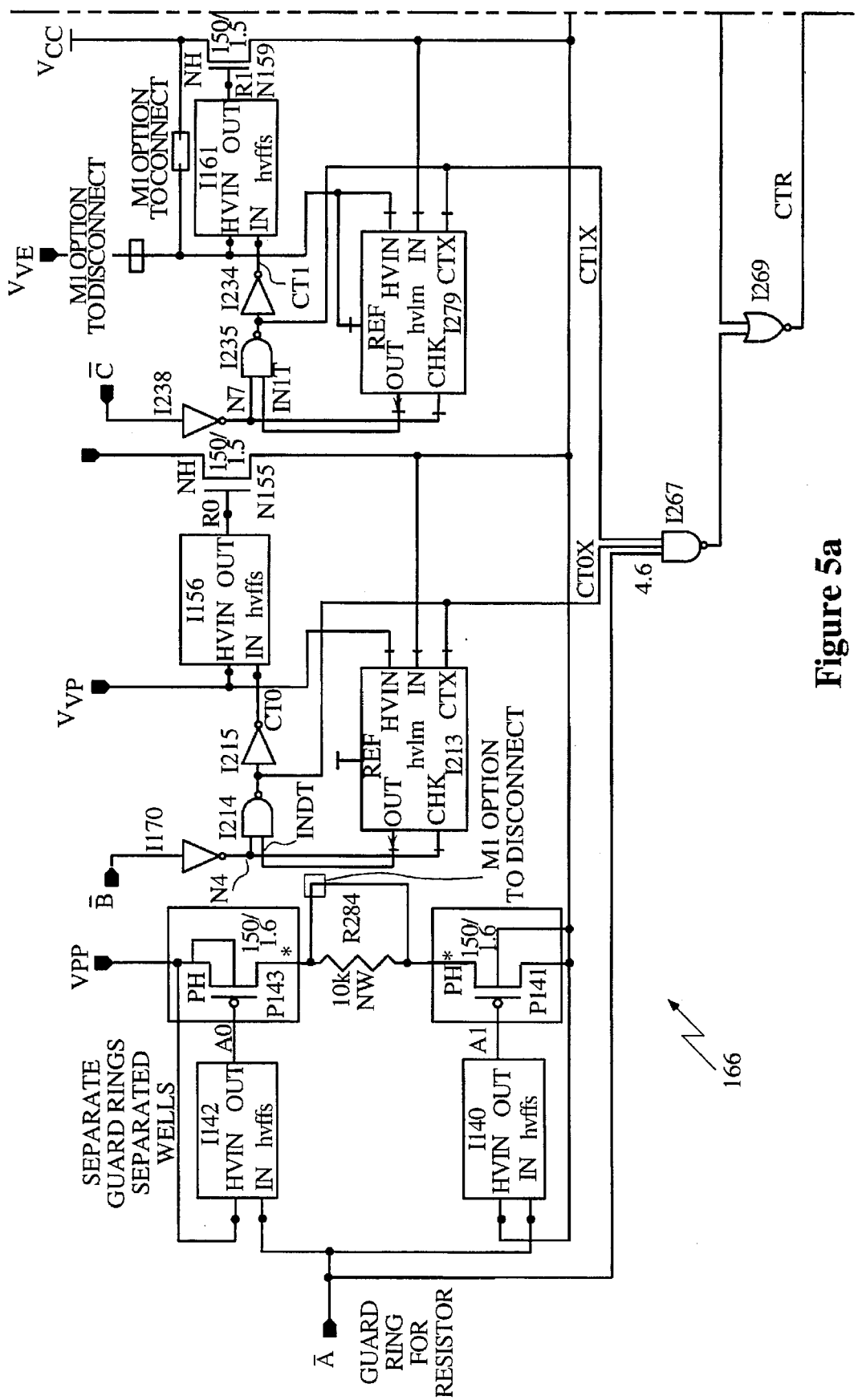
FIGS. 5a and 5b combined are a schematic diagram of a program/erase/verify multiplexor 166.
Figure 5B:
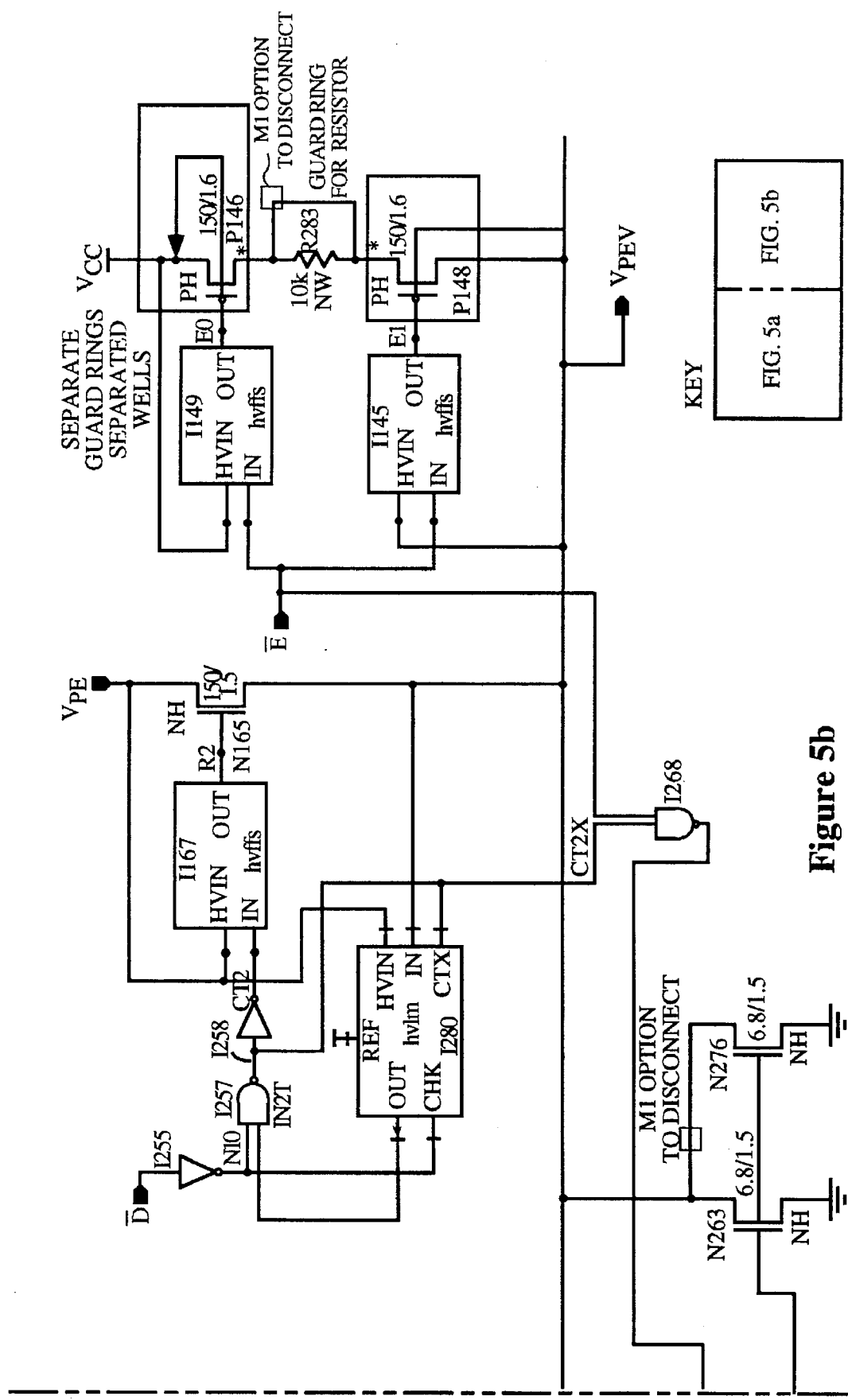

FIGS. 5a and 5b combined are (as indicated in the key of FIG. 5b) a schematic diagram of a high-voltage multiplexor used in accordance with one embodiment of the invention as multiplexor 166. The high-voltage multiplexor 166 of FIGS. 5A and 5B receives five multiplexor control inputs on terminals $\overline{A}$, $\overline{B}$, $\overline{C}$, $\overline{D}$, and $\overline{E}$ from select logic 170. To select a particular voltage to be output on terminal $V_{PEV}$, select logic 170 outputs a logic zero on the select terminal corresponding to the desired voltage. For example, to output the five-volt signal on terminal $V_{CC}$, select logic 170 outputs a logic zero to terminal $\overline{E}$. A multiplexor similar to multiplexor 166 is described in detail in the related application entitled "High-Voltage Power Multiplexor," which has been incorporated herein by reference. The invention is not limited to multiplexor 166 of FIGS. 5a and 5b, as other conventional power multiplexors are capable of selecting between the various voltages required to supply terminal $V_{PEV}$.

Figure 6:
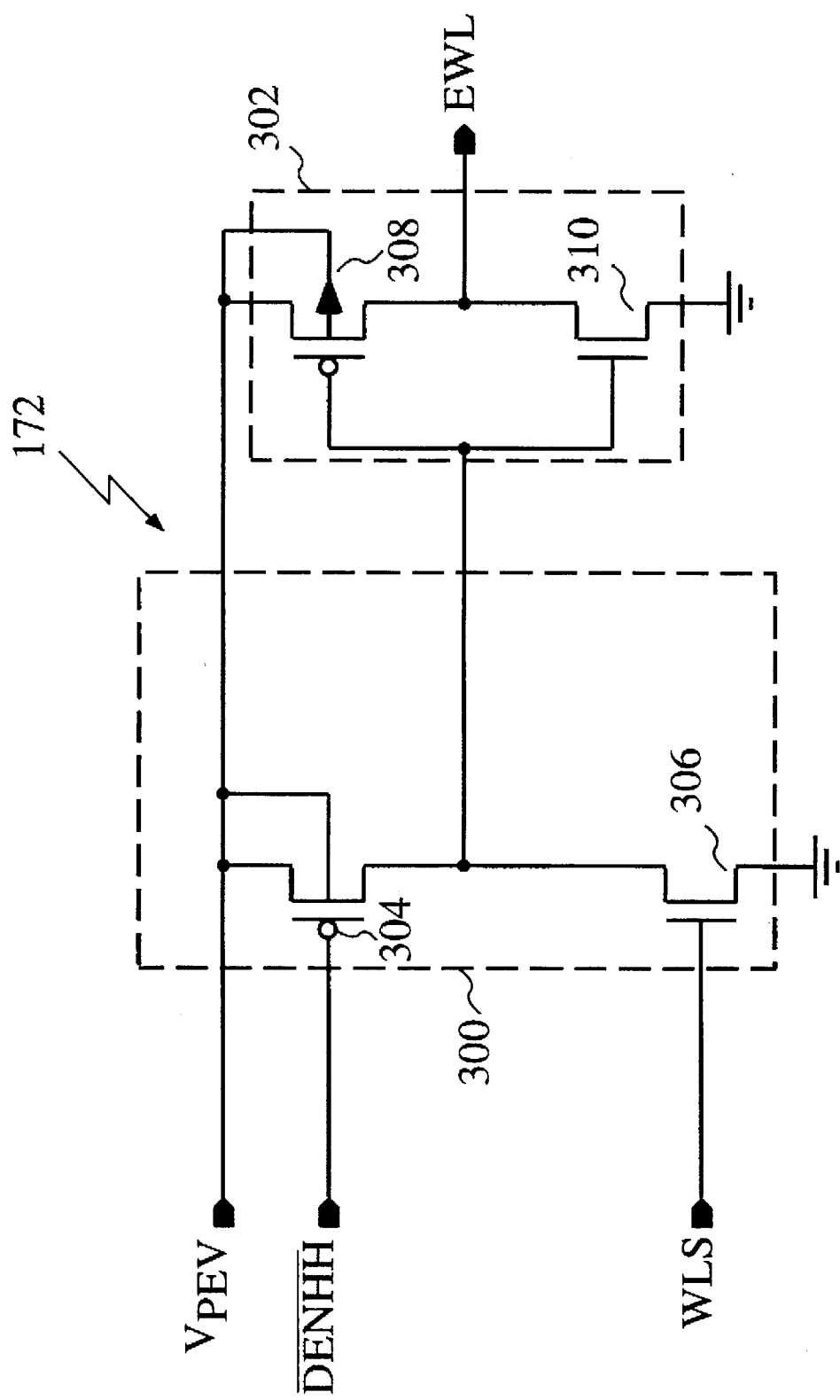
FIG. 6 is a schematic diagram of a wordline driver 172.

FIG. 6 is a schematic diagram of wordline driver 172. Wordline driver 172 includes decode logic 300 and a conventional CMOS inverter 302. Decode logic 300 includes P-type transistor 304 and N-type transistor 306. Transistor 304 has its source coupled to terminal $V_{PEV}$, its gate coupled to a high-voltage decode enable terminal $\overline{DENHH}$, and its drain coupled to the drain of transistor 306. Transistor 306 has its source coupled to ground and its gate coupled to the wordline select terminal WLS. The drains of transistors 304 and 306 are coupled to the input of inverter 302, a conventional CMOS inverter that includes a P-type transistor 308 and an N-type transistor 310. Inverter 302 is coupled between terminal $V_{PEV}$ and ground, and its output is provided to the control gate G of storage transistor 162 via EPROM wordline EWL.

The operation of wordline driver 172 is described in detail in the co-pending application entitled "Wordline Driver For Flash PLD." For purposes of the present invention, it is important to note that when a particular wordline is selected, five volts is applied to the gate of transistor 306 via the wordline select terminal WLS. This causes transistor 306 to conduct, pulling the input of inverter 302 toward ground. Consequently, the output of inverter 302, which is connected to the gate G of storage transistor 162 via the EPROM wordline EWL, is driven up to the voltage level on program/erase/verify terminal $V_{PEV}$.

Figure 7:
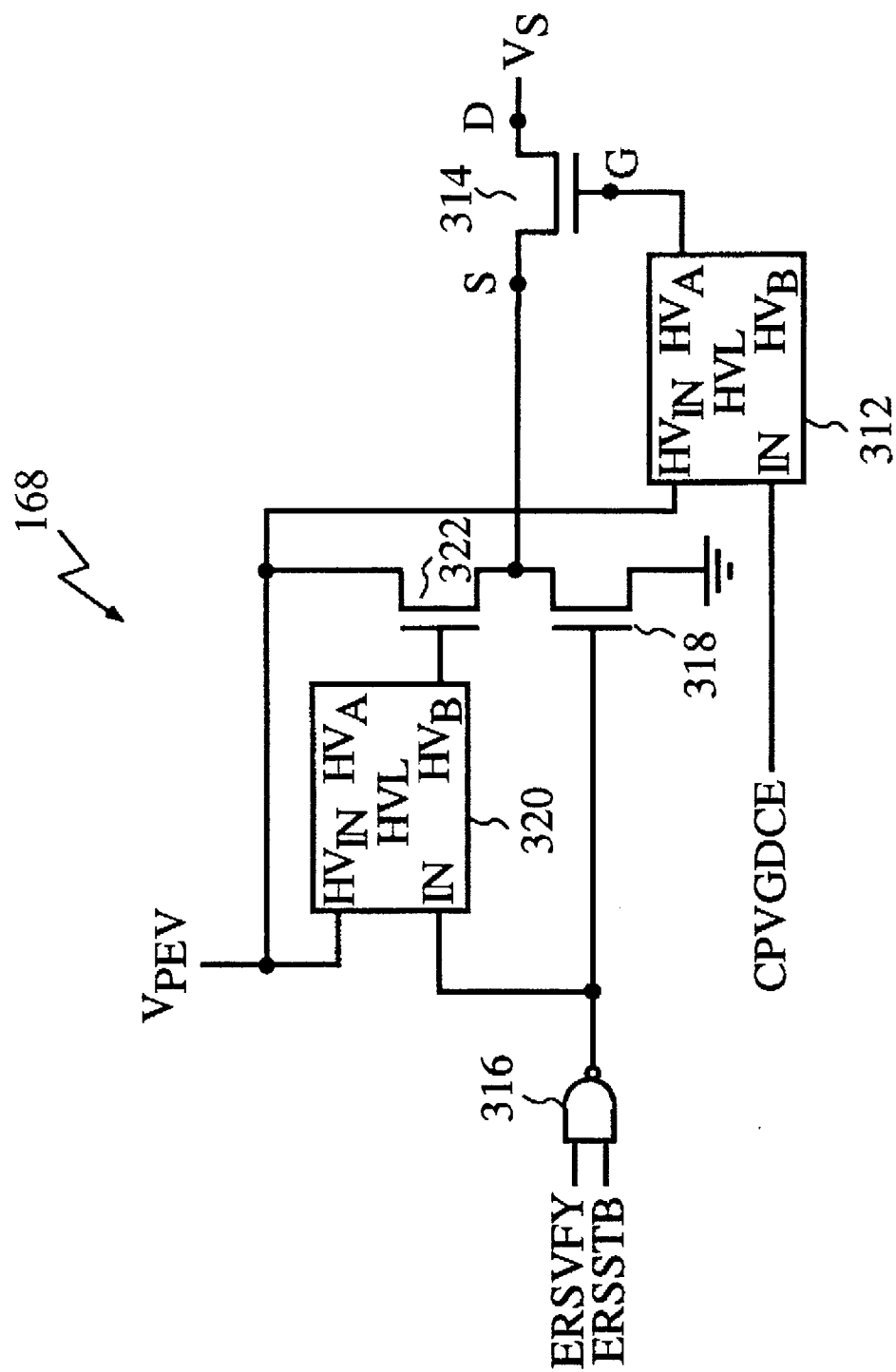
FIG. 7 is a schematic diagram of a source driver 168.

FIG. 7 is a schematic diagram of source driver 168. Source driver 168 is configured to couple the source S of storage transistor 162 to ground when storage transistor 162 is programmed, and to connect the source S of storage transistor 162 to the erase voltage on terminal $V_{PEV}$ when storage transistor 162 is erased.

In the program and erase modes the program/erase voltage on terminal $V_{PEV}$ is approximately twelve volts. In each of these modes, the voltage level on terminal CPVGDCE is approximately five volts. (CPVGDCE stands for the modes CONLOAD, PROGRAM, VERIFY, GATE DISTURB, and DC ERASE. These and other modes are discussed in detail in the incorporated application entitled "Wordline Driver For Flash PLD.")

The five-volt signal on terminal CPVGDCE is provided to a high-voltage level shifter 312, which accepts the five-volt signal and level shifts the signal so that the output on terminal $HV_A$ of level shifter 312 is approximately 12 volts (i.e., the voltage on terminal $V_{PEV}$). The level-shifted signal from level shifter 312 is then applied to the gate of a pass transistor 314, thereby turning pass transistor on. Conversely, a zero-volt signal on terminal CPVGDCE causes level shifter 312 to output zero volts, turning off pass transistor 314, thereby isolating source driver 168 from the source of storage transistor 120.

The voltage levels provided through pass transistor 314 to the source S of storage transistor 162 vary depending on whether storage transistor 162 is to be programmed or erased. When programming storage transistor 162, both the erase-verify voltage on terminal ERSVFY and the erase-strobe voltage on terminal ERSSTB are at zero volts. As a result, a NAND gate 316 outputs a logic one (i.e., five volts) to the input of a high-voltage level shifter 320 and to the gate of a transistor 318.

The five volt signal from NAND gate 316 turns on transistor 318. The output of high-voltage level shifter 320 is taken from its inverting terminal $HV_B$, so that the output of high-voltage level shifter 320 is zero volts. The zero-volt output from high-voltage level shifter 320 is supplied to the gate of a transistor 322 to switch off transistor 322. With transistor 322 off and transistor 318 on, the voltage taken between transistors 322 and 318 is pulled toward ground (i.e., toward zero volts). And, when transistor 314 is on, this zero-volt signal is transmitted to the source S of storage transistor 162 via terminal $V_S$.

When storage transistor 120 is erased, the erase-verify signal on terminal ERSVFY and the erase-strobe signal ERSSTB are high. Consequently, NAND gate 316 outputs a logic zero (approximately zero volts). The zero-volt output of NAND gate 316 turns off transistor 318 and causes level shifter 320 to provide an output voltage approximately equal to the erase voltage on terminal $V_{PEV}$ to the gate of transistor 322, thereby allowing transistor 322 to pass the voltage level on terminal $V_{PEV}$ (less a $V_t$) to the source of transistor 314. As stated above, when the voltage level on terminal CPVGDCE is high, as is the case in the erase mode, transistor 314 will conduct. Thus, in the erase mode when both the erase-verify signal on terminal ERSVFY and the erase-strobe signal on terminal ERSSTB are high, transistors 322 and 314 will convey the approximately twelve volts on terminal $V_{PEV}$ less a $V_t$ to the source S of storage transistor 162.

In the logic mode, when the PLD is acting as a logic device to perform logic function, source driver 168 is disconnected from storage transistor 162. This is done by maintaining the signal on terminal CPVGDCE low during the logic mode so that the output of high-voltage level shifter 312 will remain low, thereby keeping transistor 314 off.

Referring to FIG. 3, the present invention advantageously allows one or more of the voltages supplied by program/erase/verify voltage source 164 to be adjusted internally. As discussed above in the background section, experimentation may indicate that the correct verify program voltage on terminal $V_{VP}$ should be e.g. 7.8 volts instead of eight volts. The program, erase, or erase-verify voltages may similarly require adjustment.

Because the verify-program voltage on terminal $V_{VP}$ and the program and erase voltages supplied on terminal $V_{PE}$ are each greater than power supply voltage $V_{CC}$, the voltages supplied on terminals $V_{VP}$ and $V_{PE}$ are generated by charge pumps in generators 323 and 324, respectively. The voltage levels provided by generators 323 and 324 are determined by a configuration memory 325.

Configuration memory 325 is an array of flash memory cells. Each memory cell may be programmed to store a binary one or zero, and groups of memory cells may be combined to store higher binary values. The stored value associated with one group of memory cells is conveyed over a bus 328 to decode logic 326, which decodes the group of values and provides a regulating voltage based on the stored value to verify-program generator 323 via a bus 329. The output voltage level of generator 323 is dependent upon the signal on bus 329, and therefore upon the value stored in the corresponding group of memory cells in configuration memory 325.

An additional group of configuration bits from configuration memory 325 is supplied to a program and erase multiplexor 330 to determine the voltage level on the program/erase terminal $V_{PE}$ during the program and erase modes. This set of bits is conveyed to program and erase multiplexor 330 via configuration wordlines CWL<0:3> and configuration bitlines CBL<0:1>, which uniquely specify eight programmable configuration bits.

Figure 8:
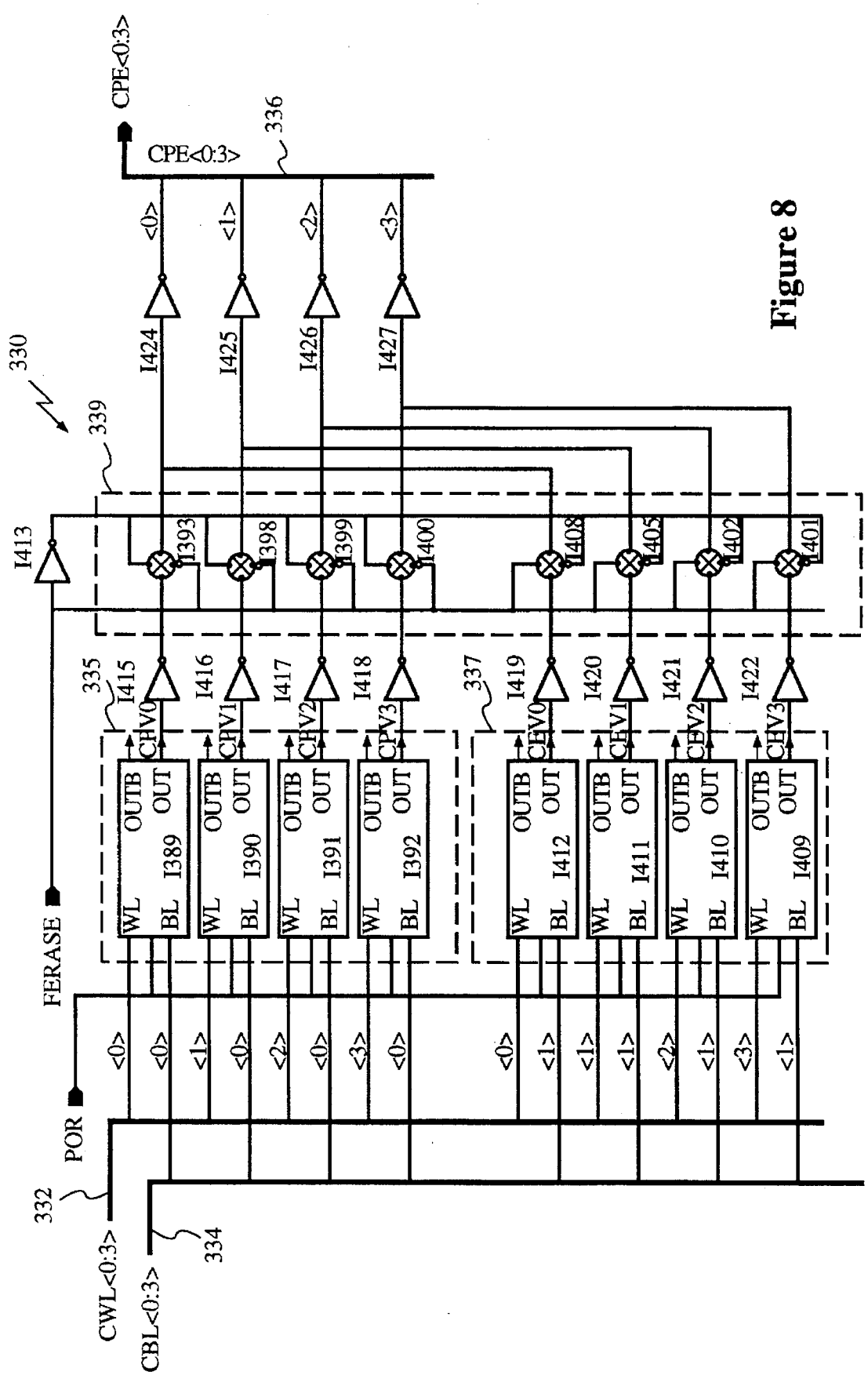
FIG. 8 is a schematic diagram of a program and erase multiplexor 330.

FIG. 8 is a schematic diagram of program and erase multiplexor 330, which includes a group of four program configuration bit storage cells (program cells 335) and a group of four erase configuration bit storage cells (erase cells 337). Each of the storage cells is a conventional latch that stores the value associated with a single configuration bit (i.e., a particular wordline/bitline pair) in configuration memory 325.

When the PLD is powered up, a power-on-reset signal on a terminal POR resets all of the storage cells in program and erase multiplexor 330. The program cells 335 and erase cells 337 are then conventionally loaded with information stored in configuration memory 325, the value stored in each configuration bit specified by a unique configuration bitline/word-line combination conveyed from configuration memory 325 to program cells 335 and erase cells 337 configuration bitlines CBL<0:1> and configuration wordlines CWL<0:3>.

For example, if wordline CWL<0> is selected, a logic one is provided to the WL terminal of cell 1389, enabling cell 1389 to store the value on bitline CBL<0> input to the BL terminal of cell 1389. As long as power is supplied to the latches of program cells 335 and erase cells 337, program cells 335 and erase cells 337 will each output a logic level that indicates the stored value of the corresponding configuration bit in configuration memory 325. These logic levels are presented to the inputs of a multiplexor 339 via eight conventional inverters.

Multiplexor 339 includes a select terminal FERASE. Depending on the voltage level on terminal FERASE, multiplexor 339 selects either the outputs from program cells 335 or the outputs from erase cells 337. In the erase mode, the voltage level on terminal FERASE is high, which causes multiplexor 339 to select the outputs stored in erase cells 337. In all other modes, including the program mode, the voltage level on terminal FERASE is low, which causes multiplexor 339 to select the outputs stored in program cells 335.

Figure 9:
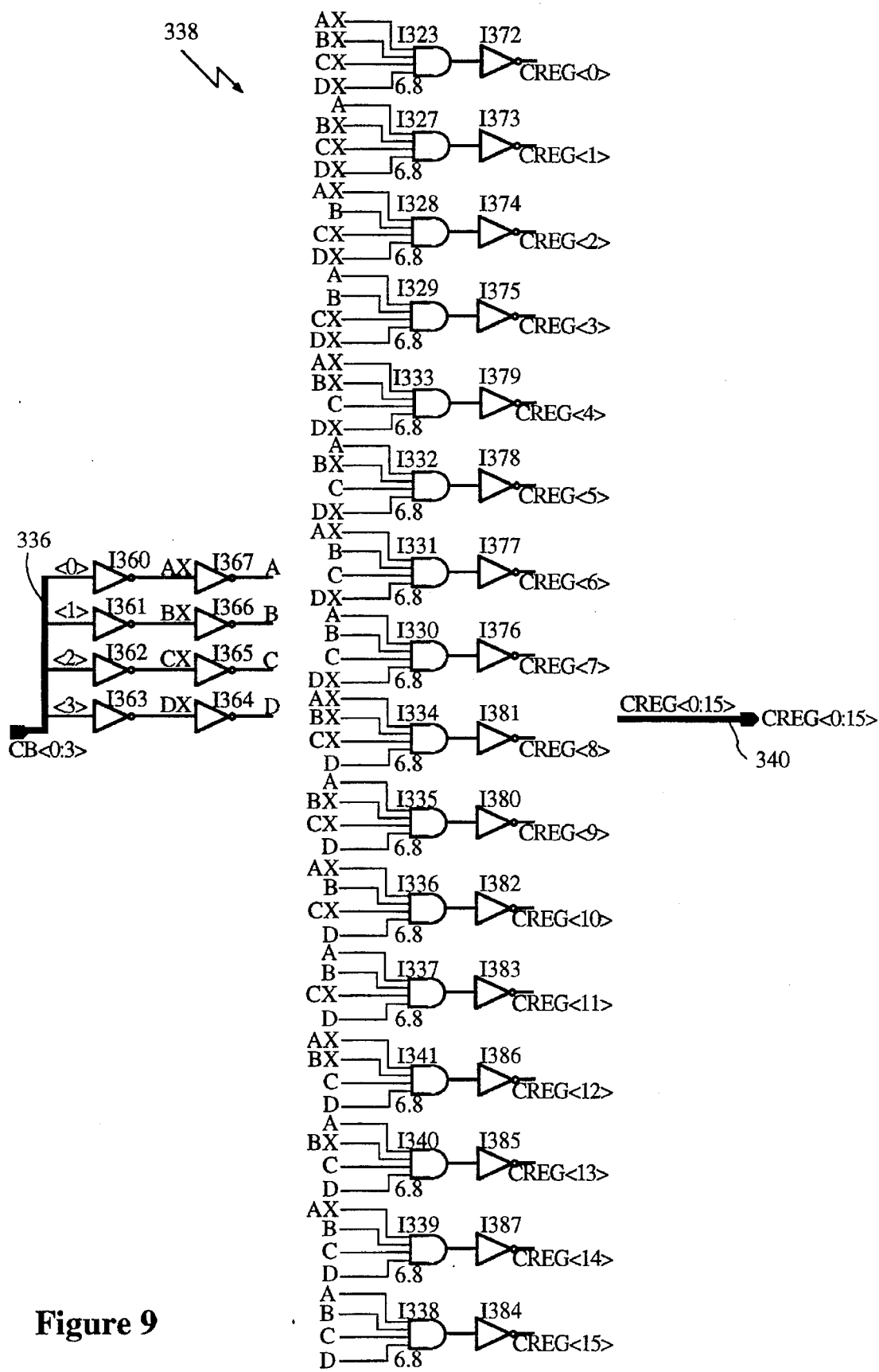
FIG. 9 is a schematic diagram of a decode logic circuit 338.

As shown in FIG. 3, the output of program and erase multiplexor 330 is fed through a bus 336 to decode logic circuit 338, which decodes the signal and provides the decoded signal to program and erase generator 324 via a 16-bit bus 340. FIG. 9 is a schematic diagram of decode logic circuit 338. Decode logic circuit 338 accepts four configuration bit signals on lines CB<0:3> from configuration memory 325 through program and erase multiplexor 330, decodes those four configuration bit signals, and outputs the decoded configuration bit signals onto sixteen output lines CREG<0:15>. Using decode logic 338, only a single one of the output signals on lines CREG<0:15> may be high at any given time. The sixteen signals on output lines CREG<0:15> of bus 340 are then conveyed to program and erase charge-pump generator 324.

Figure 10A:
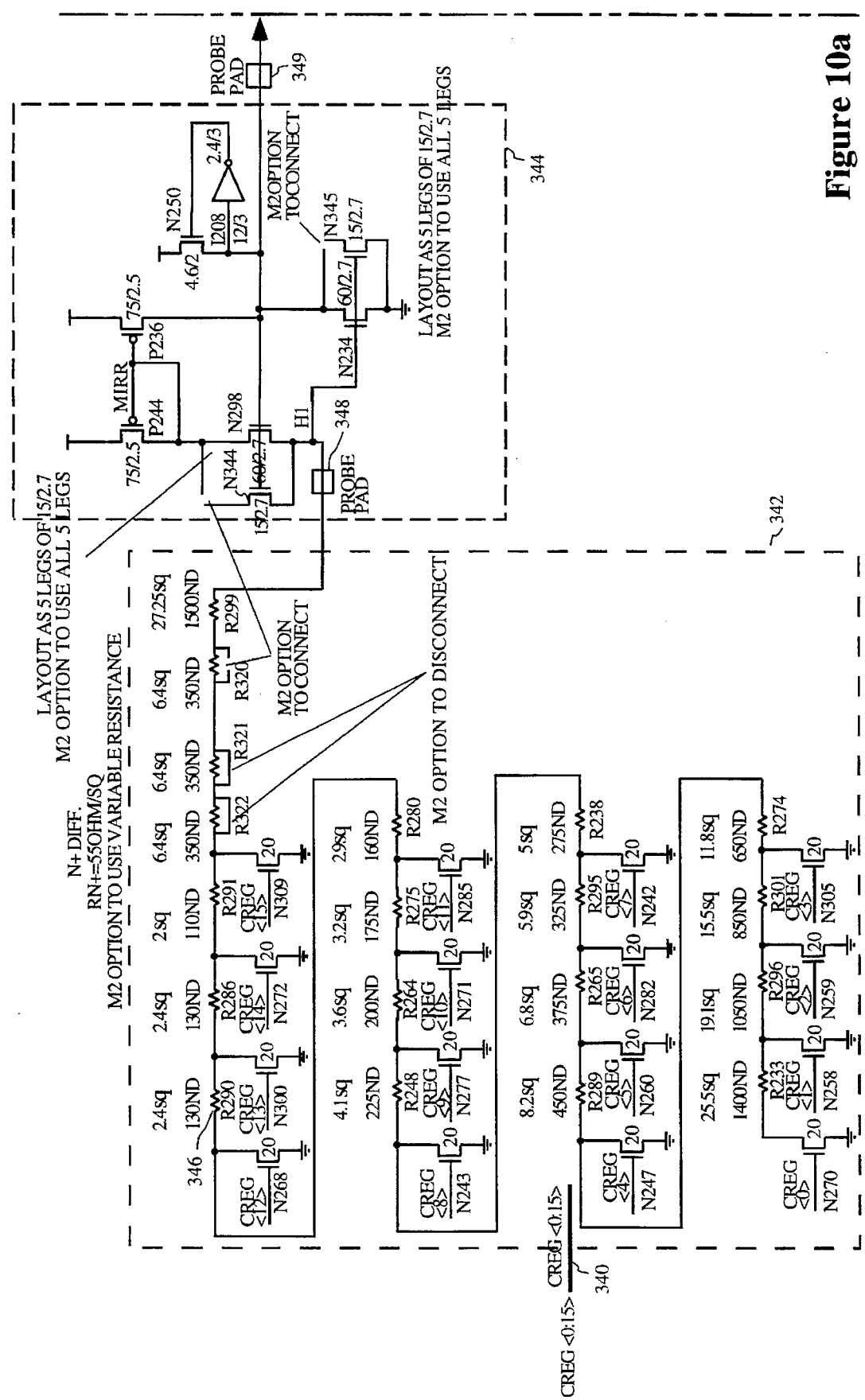
FIGS. 10a, 10b, and 10c combined are a schematic diagram of a charge-pump generator.
Figure 10B:
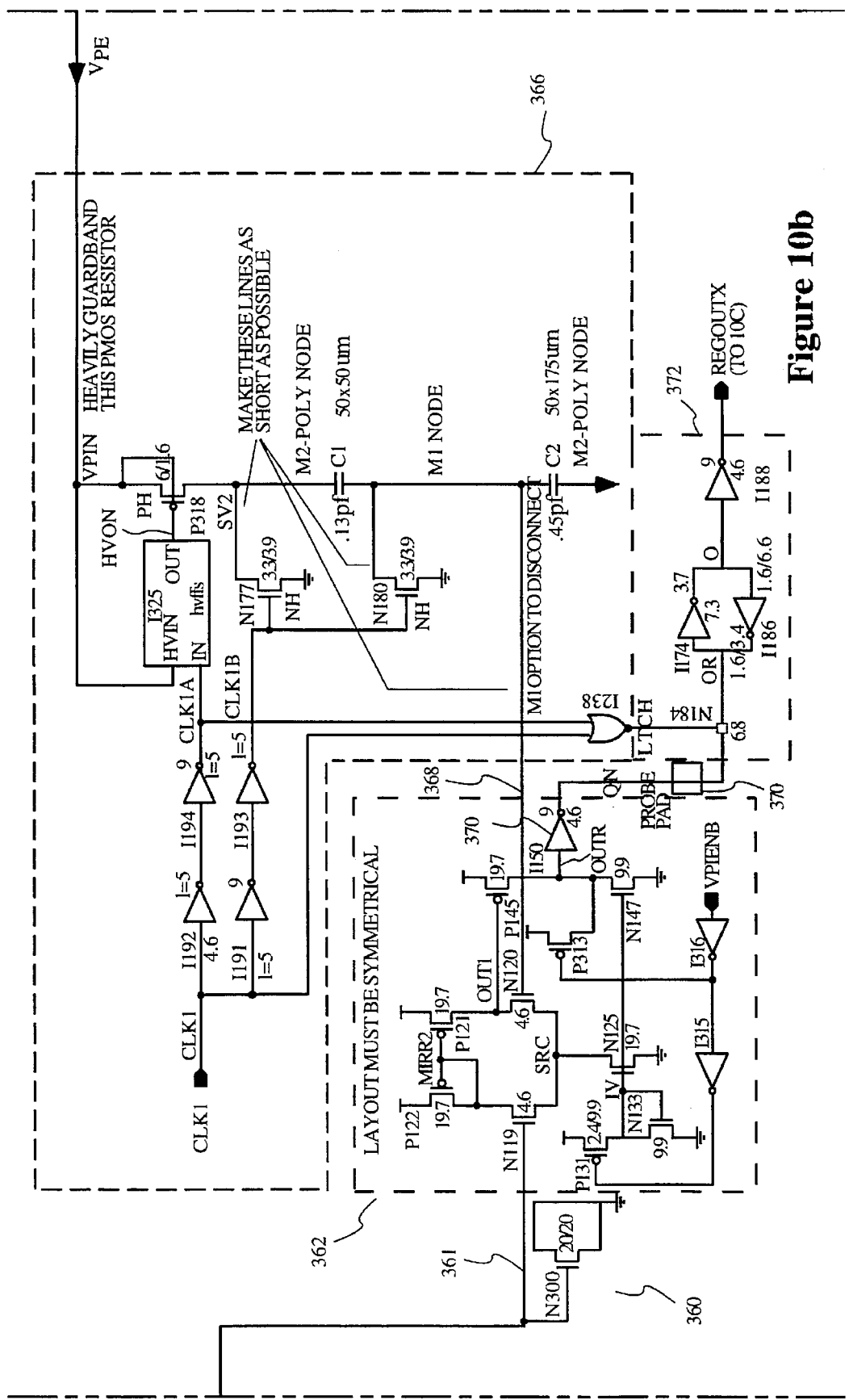
Figure 10C:
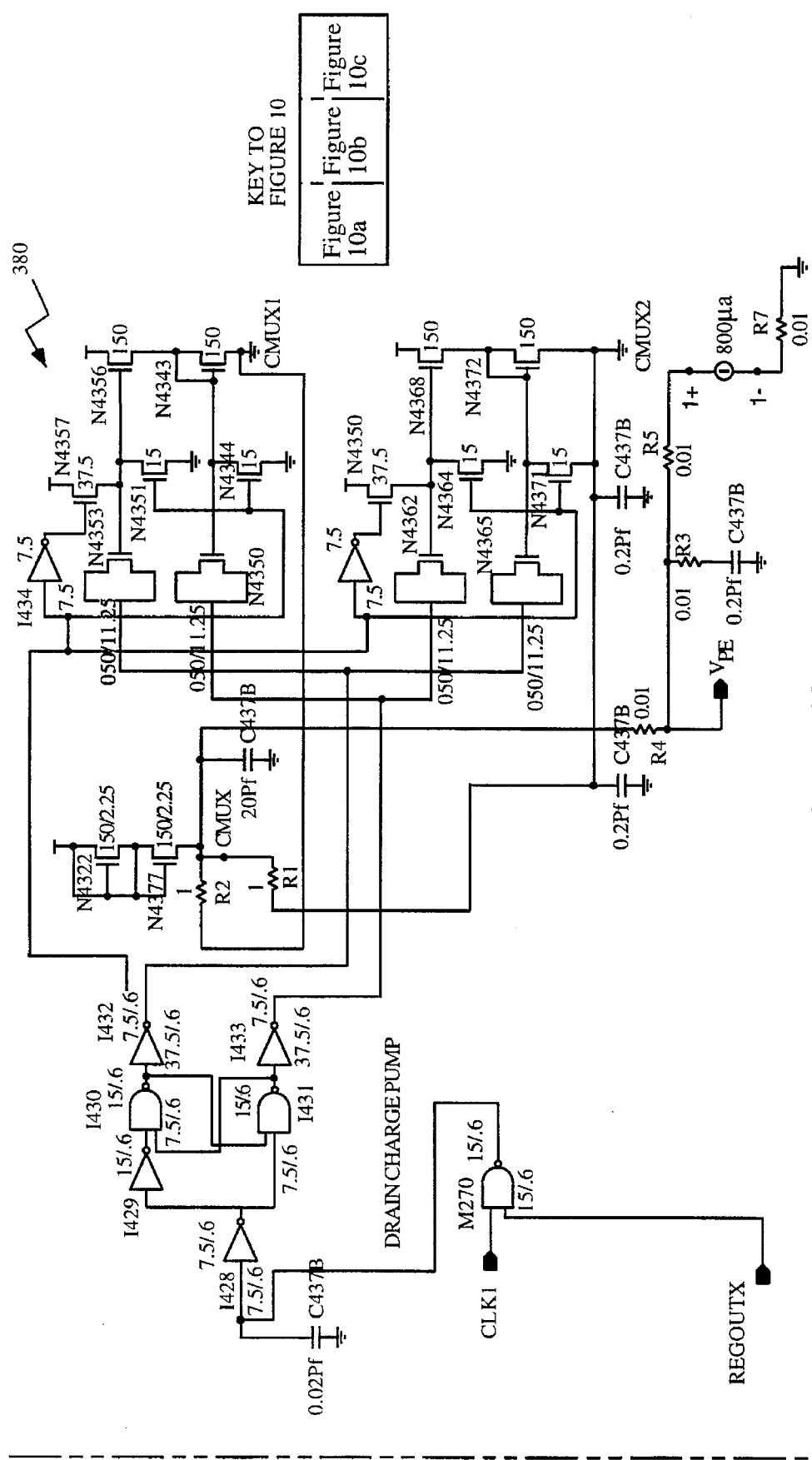

FIGS. 10a, 10b, and 10c combined are (as shown in the key of FIG. 10c) a schematic diagram of charge-pump generator 324. FIG. 10a shows a voltage divider 342 connected between the bus 340 and a conventional reference-voltage generator 344. Each of the sixteen lines CREG<0:15> on bus 340 is connected to a gate of one of the transistors shown in voltage divider 342. For example, the line CREG<12> is coupled to transistor N288 in the upper left-hand corner of voltage divider 342. When the signal on line CREG<12> is a logic one (i.e., five volts), transistor N288 is turned on, providing a path to ground for one end of a resistor 346. The voltage at the output of voltage divider 342 (taken, for example, from the probe pad 348) depends on the amount of resistance provided between the probe pad 348 and ground. Therefore, the voltage at the output of voltage divider 342 may be adjusted by selecting one of the transistors in voltage divider 342 to shunt the resistive network to ground. Because the selected transistor depends upon the output of decode logic circuit 338, which in turn depends upon the values of a set of configuration bits in configuration memory 325, the voltage at probe pad 348 may be adjusted by configuring a group of configuration bits in configuration memory 325.

Reference-voltage generator 344 is a conventional voltage generator having an output voltage that is relatively insensitive to temperature and power-supply voltage fluctuations. The output voltage level of reference-voltage generator 344 depends on the voltage input to reference-voltage generator 344, which in turn depends on the selected resistance of the resistive network in voltage divider 342. The output of reference-voltage generator 344 is coupled to a probe pad 349, which provides a convenient test point.

Referring now to FIG. 10b, the output of reference-voltage generator 344 of FIG. 10a is coupled to transistor 360 to ground. Both the source and the drain of transistor 360 are coupled to ground so that transistor 360 acts as a capacitor. The output of reference-voltage generator 344 is also coupled to an input 361 of a conventional differential amplifier 362. The other differential input is from a conventional capacitive voltage divider 366 via a differential input line 368.

Differential amplifier 362 is activated when the signal VPIENB is low. When differential amplifier 362 is active, the output, which may be taken from a probe pad 370, is either a one or a zero (i.e., five or zero volts), depending on the relative voltage levels on each of the differential inputs 361 and 368. For example, when the voltage on line 361 is greater than the voltage on differential input line 368, the voltage on line OUT1 taken from the drain of a transistor N120 is high. As a result, the transistor P145 will be off, so that the inputs to inverter 370 will be pulled toward ground by a transistor N147. Inverter 370 consequently outputs a logic one (i.e. five volts) to a latch 372 via probe pad 370.

Differential amplifier 362, voltage divider 366, and latch 372 operate conventionally to control the charge pump 380 of FIG. 10c. The output voltage of charge pump 380, taken from the terminal $V_{PE}$, is input to voltage divider 366. This output voltage is divided across capacitors C1 and C2 of voltage divider 366, and the divided voltage is conveyed via differential input line 368 to differential amplifier 362 where it is compared with the reference voltage from reference-voltage generator 344. If the differential input voltage on differential input line 368 is higher than the voltage on differential input line 361, indicating that the output voltage $V_{PE}$ of the charge pump 380 is too high, differential amplifier 362 outputs a logic one that is then stored in a latch 372. This logic one is inverted to provide a logic zero through a regulator output terminal REGOUTX to charge pump 380 of FIG. 10c. The logic zero disables charge pump 380, thereby allowing the output voltage of the charge pump 380 $V_{PE}$ to decrease. This decrease in the output voltage $V_{PE}$ decreases the divided voltage between capacitors C1 and C2 of voltage divider 366. When the divided voltage between capacitors C1 and C2 falls below the voltage on differential input terminal 361, differential amplifier 362 will output a logic zero to be stored in latch 370. The logic zero stored in latch 370 is inverted and the inverted signal is conveyed to charge pump 380 via terminal REGOUTX. The logic one on terminal REGOUTX enables charge pump 380, thereby increasing the output voltage level on terminal $V_{PE}$. In this way, the output voltage on terminal $V_{PE}$ is constantly compared with the reference voltage provided by reference-voltage generator 344. Reprogramming the configuration bits to turn on a different transistor in voltage divider 342 will change the reference voltage provided to differential amplifier 362, and will thereby change the output voltage on terminal $V_{PE}$. Thus, configuration memory 325 allows the program and erase voltages to be optimized.

Verify-program generator 323 operates in combination with decode logic 326 and configuration memory 325 in much the same way that program and erase generator 324 operates in conjunction with decode logic circuit 338 and configuration memory 325. However, because verify-program generator 323 only generates a single verify program voltage, there is no need to provide a multiplexor similar to program and erase multiplexor 330.

Figure 11:
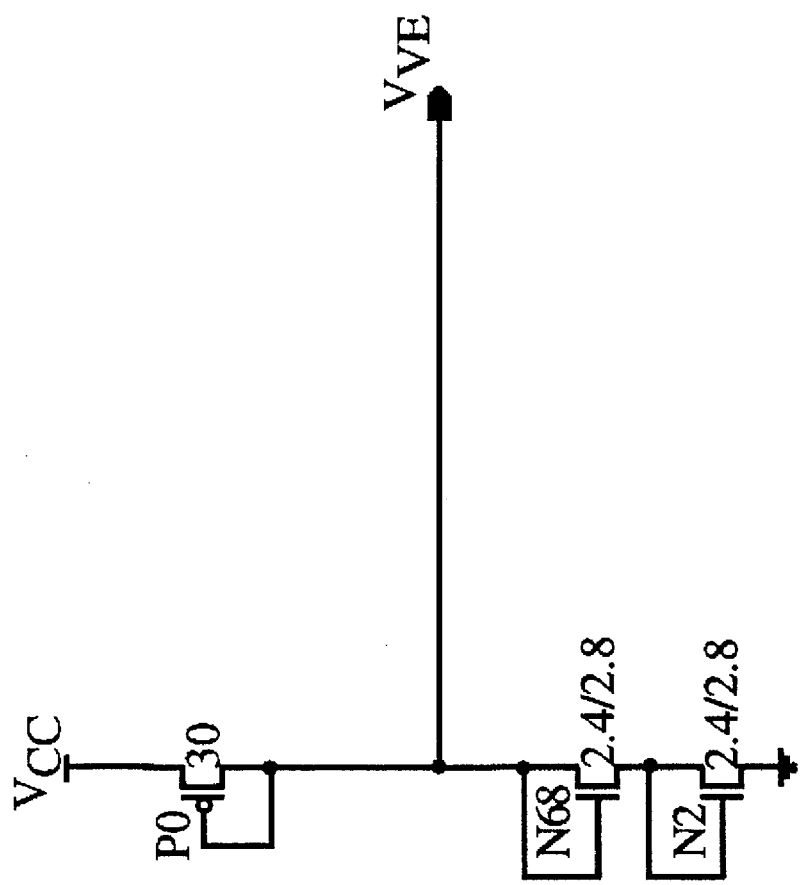
FIG. 11 is a schematic diagram of an embodiment of verify-erase generator 327.

FIG. 11 is a schematic diagram of an embodiment of verify-erase generator 327. Three transistors (PMOS transistor P0 and NMOS transistors N2 and N68) are configured as a conventional voltage divider to provide approximately 2.7 volts to the verify-erase terminal $V_{VE}$ (which becomes 2 V on terminal $V_{PEV}$ after a $V_t$ drop through multiplexor 166). Those numbers not preceded by an "N" or a "P" represent the aspect ratio (i.e., the ratio of channel width to channel length) for the associated transistors. Where no denominator is provided for the aspect ratio (e.g., transistor P0 has an aspect ratio of 30), the denominator is one.

The above description is illustrative and not limiting. Further modifications of the above-described circuitry will be apparent to those skilled in the art. For example, the inventive program/program-verify scheme may be used in programming non-flash EPROMs, and the inventive erase/erase-verify scheme may be used in erasing flash and non-flash EEPROMS. Moreover, the inventive program and erase schemes need not be limited to PLD applications. Such variations are intended to fall within the scope of the appended claims.

What is claimed is:

1. A programmable logic device (PLD) comprising:

a flash storage transistor having a control gate, a source terminal, and a drain terminal, the storage transistor having a programmable threshold voltage;

a programming voltage supply providing a programming voltage to the storage transistor, the programming voltage supply including a programming voltage generator;

a configurable verify-voltage generator providing a verify voltage to the control gate of the storage transistor, wherein the verify-voltage generator further comprises a plurality of memory elements, wherein the memory elements are programmable to select one of a plurality of verify voltage levels;

a switch coupled to the programming voltage supply, the verify-voltage generator, and the control gate, the switch for providing either of the programming voltage or the verify voltage to the control gate; and a verify sense amplifier coupled to the source and drain terminals of the storage transistor, the sense amplifier indicating whether current passes through the storage transistor when the verify voltage is applied to the gate of the storage transistor.

2. An integrated circuit comprising:

a memory cell having a control gate, a source terminal, and a drain terminal, the memory cell having a programmable threshold voltage;

a programming voltage supply for providing a programming voltage to the control gate; and a configurable verify-voltage generator for providing a verify voltage to the control gate, wherein the verify-voltage generator is capable of providing a plurality of voltage levels for testing whether the cell is programmed.

3. The circuit of claim 2, further comprising a switch coupled to the programming voltage supply, the verify-voltage generator, and the control gate, the switch for providing either of the programming voltage or the verify voltage to the control gate.

4. The circuit of claim 2, further comprising a verify sense amplifier coupled to the source and drain terminals.

5. The circuit of claim 2, wherein the programming voltage supply comprises a programming voltage generator.

6. The circuit of claim 5, wherein the programming voltage generator is capable of providing a plurality of programming voltage levels.

7. The circuit of claim 6, wherein the programming-voltage generator further comprises a plurality of programmable memory elements, wherein the elements are programmable to select one of the plurality of programming voltage levels.

8. The circuit of claim 7, wherein the memory elements are flash memory cells.

9. The circuit of claim 2, wherein the programming voltage supply comprises a pin, wherein the programming voltage is supplied to the integrated circuit through the pin by an external power supply.

10. The circuit of claim 2, wherein the verify-voltage generator further comprises a plurality of programmable memory elements, wherein the elements are programmable to select one of the plurality of voltage levels for testing whether the cell is programmed.

11. The circuit of claim 3, wherein the programming voltage supply comprises:

a voltage selector connected to the switch;

a pin coupled to the switch, wherein an external voltage is supplied to the integrated circuit through the pin by an external power supply; and a high-voltage detector coupled between the pin and the voltage selector, the high-voltage detector having a high-voltage threshold.

12. The circuit of claim 11, wherein if the external voltage is less than the high-voltage threshold, the voltage selector selects the external voltage as a verify voltage.

13. The circuit of claim 11, wherein if the external voltage is greater than the high-voltage threshold, the voltage selector selects the verify-voltage generator to provide a verify voltage.

14. The circuit of claim 2, wherein the verify-voltage generator is capable of providing a plurality of voltage levels for testing whether the cell is erased.

15. The circuit of claim 11, wherein the verify-voltage generator further comprises a plurality of programmable memory elements that may be programmed to select one of a plurality of erase-verify voltage levels for testing whether the cell is erased.

16. The circuit of claim 2, wherein the threshold voltage is higher when the cell is programmed than when the cell is erased.

* * * * *

UNITED STATES PATENT AND TRADEMARK OFFICE
CERTIFICATE OF CORRECTION

PATENT NO. : 5,661,685

DATED : Aug. 26, 1997

INVENTOR(S) : Napoleon W. Lee, Derek R. Curd, Sholeh Diba, Prasad Sastry, Mihai G. Statovici, Kameswara K. Rao It is certified that error appears in the above-identified patent and that said Letters Patent is hereby corrected as shown below:

On the front page, under the section titled "References Cited, U.S. Patent Documents" insert the following:

--4,896,296   1/1990   Turner et al.      365/189

5,237,218   8/1993   Josephson et al.   307/465

5,452,229   9/1995   Shankar et al.     364/489--

Signed and Sealed this

Twenty-sixth Day of January, 1999

Attest:

Attesting Officer

*Acting Commissioner of Patents and Trademarks*